(12) United States Patent
Murakoshi et al.

(10) Patent No.: US 11,378,633 B2
(45) Date of Patent: Jul. 5, 2022

(54) RADIO FREQUENCY AMPLIFYING DEVICE AND MAGNETIC RESONANCE IMAGING APPARATUS

(71) Applicant: Canon Medical Systems Corporation, Otawara (JP)

(72) Inventors: Hiroaki Murakoshi, Tama (JP); Susumu Kawaguchi, Hachioji (JP); Masaki Tanji, Nasusiobara (JP); Hirofumi Yamaki, Nasusiobara (JP); Hajime Tanaka, Sakura (JP)

(73) Assignee: Canon Medical Systems Corporation, Otawara (JP)

( * ) Notice: Subject to any disclaimer, the term of this patent is extended or adjusted under 35 U.S.C. 154(b) by 481 days.

(21) Appl. No.: 16/568,710

(22) Filed: Sep. 12, 2019

(65) Prior Publication Data

US 2020/0088816 A1  Mar. 19, 2020

(30) Foreign Application Priority Data

Sep. 14, 2018 (JP) .............................. JP2018-172423

(51) Int. Cl.
*G01R 33/36* (2006.01)
*H03F 3/189* (2006.01)

(52) U.S. Cl.
CPC ......... *G01R 33/3614* (2013.01); *H03F 3/189* (2013.01); *H03F 2200/102* (2013.01); *H03F 2200/451* (2013.01)

(58) Field of Classification Search
CPC ................ G01R 33/3614; H03F 3/189; H03F 2200/102; H03F 2200/451
See application file for complete search history.

(56) References Cited

U.S. PATENT DOCUMENTS

| 4,412,337 A * | 10/1983 | Bickley ..................... H03F 3/24 332/162 |
| 2014/0132266 A1 | 5/2014 | Soejima et al. |
| 2018/0106878 A1 | 4/2018 | Soejima et al. |

FOREIGN PATENT DOCUMENTS

| JP | 02-305548 A | 12/1990 |
| JP | 2014-079572 A | 5/2014 |
| JP | 2017-213042 A | 12/2017 |

* cited by examiner

*Primary Examiner* — Susan S Lee
(74) *Attorney, Agent, or Firm* — Oblon, McClelland, Maier & Neustadt, L.L.P.

(57) ABSTRACT

A radio frequency amplifying device according to an embodiment includes amplifying circuitry, obtaining circuitry, and correcting circuitry. The amplifying circuitry is configured to output an amplified signal obtained by amplifying a signal input thereto. The obtaining circuitry is configured to obtain an envelope indicating a waveform of a radio frequency signal as digital data. The correcting circuitry is configured to correct the obtained envelope on the basis of a rising characteristic of the amplifying circuitry and to input the signal generated on the basis of the envelope resulting from the correction to the amplifying circuitry.

7 Claims, 5 Drawing Sheets

RADIO FREQUENCY AMPLIFYING DEVICE AND MAGNETIC RESONANCE IMAGING APPARATUS

CROSS-REFERENCE TO RELATED APPLICATIONS

This application is based upon and claims the benefit of priority from Japanese Patent Application No. 2018-172423, filed on Sep. 14, 2018; the entire contents of which are incorporated herein by reference.

FIELD

Embodiments described herein relate generally to a radio frequency amplifying device and a magnetic resonance imaging apparatus.

BACKGROUND

Conventionally, Magnetic Resonance Imaging (MRI) apparatuses use a Radio Frequency (RF) amplifier (amplifying circuitry) configured to amplify a radio frequency (an RF signal).

DETAILED DESCRIPTION

A radio frequency amplifying device according to an embodiment includes amplifying circuitry, obtaining circuitry, and correcting circuitry. The amplifying circuitry is configured to output an amplified signal obtained by amplifying a signal input thereto. The obtaining circuitry is configured to obtain an envelope indicating a waveform of a radio frequency signal as digital data. The correcting circuitry is configured to correct the obtained envelope on the basis of a rising characteristic of the amplifying circuitry and to input the signal generated on the basis of the envelope resulting from the correction to the amplifying circuitry.

Exemplary embodiments of a radio frequency amplifying device and a magnetic resonance imaging apparatus will be explained in detail below, with reference to the accompanying drawings. Possible embodiments of the radio frequency amplifying device and the magnetic resonance imaging apparatus of the present disclosure are not limited to the embodiments described below.

Figure 1:
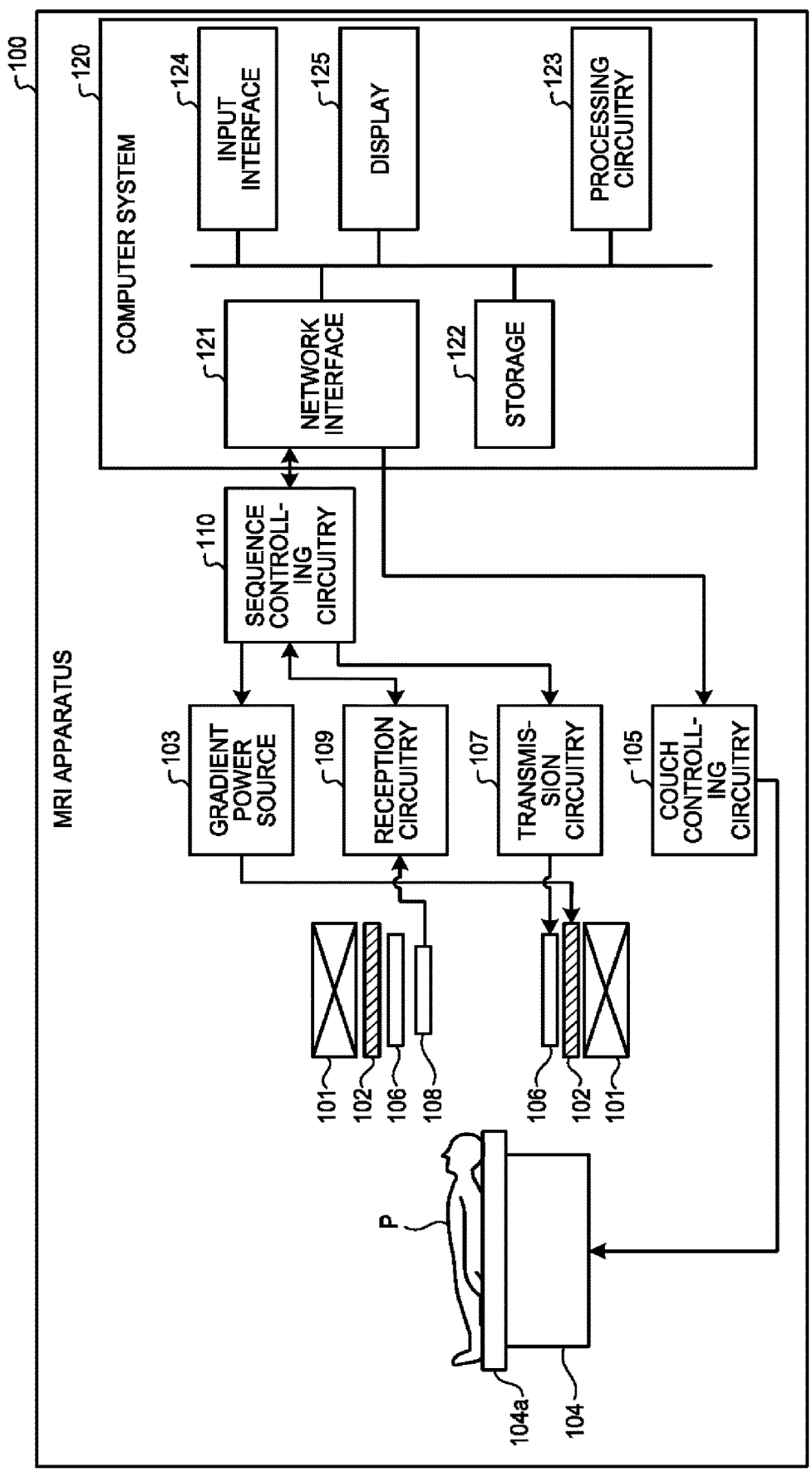
FIG. 1 is a block diagram illustrating a configuration of a magnetic resonance imaging apparatus according to an embodiment.

FIG. 1 is a block diagram illustrating a configuration of a Magnetic Resonance Imaging (MRI) apparatus 100 according to an embodiment. The MRI apparatus 100 includes a static magnetic field magnet 101, a gradient coil 102, a gradient power source 103, a couch 104, couch controlling circuitry 105, a transmission coil 106, transmission circuitry 107, a reception coil 108, reception circuitry 109, sequence controlling circuitry 110, and a computer system 120. The MRI apparatus 100 does not include an examined subject (hereinafter, "patient") P (e.g., a human body).

The static magnetic field magnet 101 is a magnet formed to have a hollow and circular cylindrical shape (which may have an oval cross-section orthogonal to the axis thereof) and is configured to generate a uniform static magnetic field in the space inside thereof.

The gradient coil 102 is a coil formed to have a hollow and circular cylindrical shape (which may have an oval cross-section orthogonal to the axis thereof) and is configured to generate a gradient magnetic field.

The gradient power source 103 is configured to supply an electric current to the gradient coil 102. For example, the gradient power source 103 individually supplies an electric current to each of three coils structuring the gradient coil 102

The couch 104 includes a couchtop 104a on which the patient P is placed. Under control of the couch controlling circuitry 105, the couchtop 104a is inserted to the inside of the hollow space (an image taking opening) of the gradient coil 102 while the patient P is placed thereon. The couch controlling circuitry 105 is a processor configured, under control of the computer system 120, to drive the couch 104 so as to move the couchtop 104a in longitudinal directions and up-and-down directions.

The transmission coil 106 is arranged on the inside of the gradient coil 102 and is configured to generate a radio frequency magnetic field by receiving a supply of a radio frequency signal from the transmission circuitry 107.

The transmission circuitry 107 is configured to generate the Radio Frequency (RF) signal on the basis of digital data output from the sequence controlling circuitry 110. The transmission circuitry 107 is configured to output the generated radio frequency signal to the transmission coil 106. The transmission circuitry 107 is an example of the radio frequency amplifying device according to the present embodiment. Details of the configuration of the transmission circuitry 107 will be explained later.

The reception coil 108 is arranged on the inside of the gradient coil 102 and is configured to receive a Magnetic Resonance signal (hereinafter, "MR signal") emitted from the patient P due to an influence of the radio frequency magnetic field. When having received the MR signal, the reception coil 108 is configured to output the received MR signal to the reception circuitry 109. The reception circuitry 109 is configured to generate MR data on the basic of the MR signal output from the reception coil 108. Further, the reception circuitry 109 is configured to transmit the generated MR data to the sequence controlling circuitry 110.

The sequence controlling circuitry 110 is configured to perform an image taking process on the patient P, by controlling the gradient power source 103, the transmission circuitry 107, and the reception circuitry 109, on the basis of sequence information transmitted thereto from the computer system 120. For example, the sequence controlling circuitry 110 may be realized by using a processor or may be realized by using a combination of software and hardware. The sequence controlling circuitry 110 is configured to transmit the digital data to the transmission circuitry 107 on the basis of the sequence information.

In this situation, the sequence information is information defining a procedure for performing the image taking process and includes information about controlling the transmission circuitry 107. Further, the sequence information includes the intensity of the power source to be supplied to the gradient coil 102 by the gradient power source 103, as well as timing with which the reception circuitry 109 detects the MR signal, and the like. Details of the information about controlling the transmission circuitry 107 that is included in the sequence information will be explained later.

The sequence controlling circuitry 110 is configured to transfer the received MR data to the computer system 120, when having received the MR data from the reception circuitry 109 as a result of performing the image taking process on the patient P by driving the gradient power source 103, the transmission circuitry 107, and the reception circuitry 109.

The computer system 120 is configured to exercise overall control of the PRI apparatus 100, to acquire data, and to reconstruct images. The computer system 120 includes a network interface 121, storage 122, processing circuitry 123, an input interface 124, and a display 125.

The network interface 121 is configured to transmit the sequence information to the sequence controlling circuitry 110 and to receive the MR data from the sequence controlling circuitry 110. Further, when having received the MR data, the network interface 121 is configured to store the received MR data into the storage 122.

The storage 122 is configured to store various types of programs therein. The storage 122 is realized by using, for example, a semiconductor memory element such as a Random Access Memory (RAM), a flash memory, or the like, or a hard disk, an optical disk, or the like. The storage 122 may also be used as a non-transitory storage medium realized with hardware.

The input interface 124 is configured to receive various types of instructions and inputs of information from an operator such as a medical doctor, a radiological technologist, or the like. The input interface 124 is realized by using, for example, a trackball, a switch button, a mouse, a keyboard, and/or the like. The input interface 124 is connected to the processing circuitry 123 and is configured to convert an input operation received from the operator into an electric signal and to output the electric signal to the processing circuitry 123.

The display 125 is configured, under control of the processing circuitry 123, to display various types of Graphical User Interfaces (GUIs), Magnetic Resonance (MR) images, and the like.

The processing circuitry 123 is configured to exercise overall control of the MRI apparatus 100. More specifically, the processing circuitry 123 is configured to control the image taking process by generating the sequence information on the basis of an image taking condition input by the operator via the input interface 124 and transmitting the generated sequence information to the sequence controlling circuitry 110. Further, the processing circuitry 123 is configured to control an image reconstructing process performed on the basis of the MR data sent thereto from the sequence controlling circuitry 110 as a result of the image taking process and to control display processes performed by the display 125. The processing circuitry 123 is realized by using a processor.

The processing circuitry 123 is configured to realize functions corresponding to various types of programs by executing the programs read from the storage 122. The processing circuitry 123 may be structured by combining together a plurality of independent processors.

Figure 2:
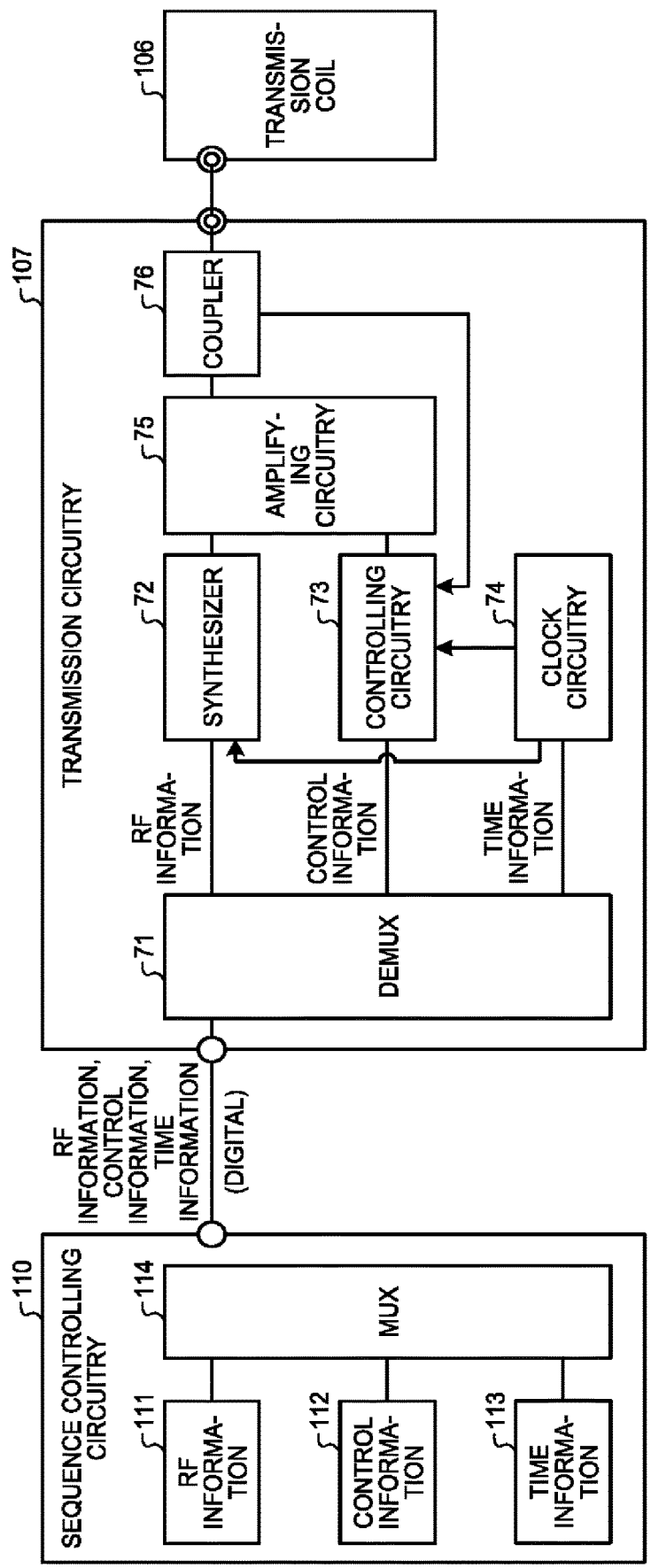
FIG. 2 is a block diagram illustrating exemplary configurations of sequence controlling circuitry and transmission circuitry according to the embodiment.

Next, details of the sequence controlling circuitry 110 and the transmission circuitry 107 according to the present embodiment will be explained. FIG. 2 is a block diagram illustrating exemplary configurations of the sequence controlling circuitry 110 and the transmission circuitry 107 according to the present embodiment.

As illustrated in FIG. 2, the sequence controlling circuitry 110 includes a multiplexer (MUX) 114. The MUX 114 is configured to transmit RF information 111, control information 112, and time information 113 to the transmission circuitry 107. The RF information 111, the control information 112, and the time information 113 are each digital data.

The RF information 111 is information defining the radio frequency signal generated by the transmission circuitry 107. The RF information 111 in the present embodiment includes an envelope indicating the waveform of the radio frequency signal. The envelope may be comprehended as an outline of the radio frequency signal.

The control information 112 is definition information of internal operations of the transmission circuitry 107. More specifically, the control information 112 is information defining the status of amplifying circuitry 75 (explained later). In the present embodiment, the status of the amplifying circuitry 75 is indicated as one of two types, namely, "operate" in which an amplified signal outputting process is being performed; and "standby" in which no amplified signal outputting process is being performed.

The time information 113 is information indicating timing to start outputting the amplified signal. For example, the time information 113 indicates a time to start outputting the amplified signal.

The RF information 111, the control information 112, and the time information 113 are, for example, included in the sequence information transmitted from the computer system 120 to the sequence controlling circuitry 110.

Further, the sequence controlling circuitry 110 and the transmission circuitry 107 may be connected to each other in a wired manner such as via an optical fiber or may be connected to each other by wireless communication. Further, in the present embodiment, the method used for transferring the digital data from the sequence controlling circuitry 110 to the transmission circuitry 107 may be via a serial interface or via a parallel interface.

Further, as illustrated in FIG. 2, the transmission circuitry 107 includes a demultiplexer (DEMUX) 71, a synthesiser 72, controlling circuitry 73, clock circuitry 74, the amplifying circuitry 75, and a coupler 76.

The DEMUX 71 is configured to obtain, from the sequence controlling circuitry 110, the RE information 111, the control information 112, and the time information 113 each as digital data. The DEMUX 71 is an example of the obtaining circuitry according to the present embodiment. The DEMUX 71 is configured to transmit the obtained RF information 111 to the synthesizer 72. Further, the DEMUX 71 is configured to transmit the obtained control information 112 to the controlling circuitry 73. The DEMUX 71 is configured to transmit the obtained time information 113 to the clock circuitry 74.

The amplifying circuitry 75 is configured to output the amplified signal obtained by amplifying a signal input thereto. More specifically, the amplifying circuitry 75 is configured to receive an input of a radio frequency signal from the synthesizer 72. Further, the amplifying circuitry 75 is configured to output the amplified signal to the coupler 76. In the present embodiment, the radio frequency signal input to the amplifying circuitry 75 from the synthesizer 72 will be referred to as an RF input signal, whereas the amplified signal output from the amplifying circuitry 75 to the coupler 76 will be referred to as an RE output signal.

The synthesizer 72 is configured to correct the obtained envelope on the basis of a rising characteristic of the amplifying circuitry 75. Further, the synthesizer 72 is configured to generate the RF input signal on the basis of the envelope resulting from the correction with the timing indicated by the time information 113 and to input the generated RE input signal to the amplifying circuitry 75. More specifically, the synthesizer 72 is configured to generate the RF input signal with the timing of which the synthesizer 72 is notified by the clock circuitry 74 (explained later) and to input the generated RE input goal to the amplifying circuitry 75.

In the present embodiment, the synthesizer 72 generates the RF input signal by, for example, performing a Digital/Analog (D/A) conversion on the envelope resulting from the correction. More specifically, the synthesizer 72 generates the waveform of a radio frequency pulse on the basis of the envelope. Further, the synthesizer 72 generates the radio frequency signal corresponding to a resonance frequency (a Larmor frequency) unique to a target atomic nucleus placed in the static magnetic field. After that, the synthesizer 72 generates a radio frequency pulse signal by modulating the amplitude of the generated radio frequency signal with the waveform of the radio frequency pulse. In the present embodiment, the radio frequency pulse signal resulting from the modulation will be referred to as the RF input signal. Although the synthesizer 72 is illustrated as single circuit in FIG. 2, the synthesizer 72 may be structured with a plurality of circuits. The synthesizer 72 is an example of the correcting circuitry according to the present embodiment.

In the present example, the rising characteristic of the amplifying circuitry 25 denotes a characteristic where there is a delay in the amplifying process at the start of an output from the amplifying circuitry 75. Accordingly, for a certain period of time since the start of an output from the amplifying circuitry 75, a signal that has been input thereto may be output without being amplified sufficiently in some situations.

Figure 5:
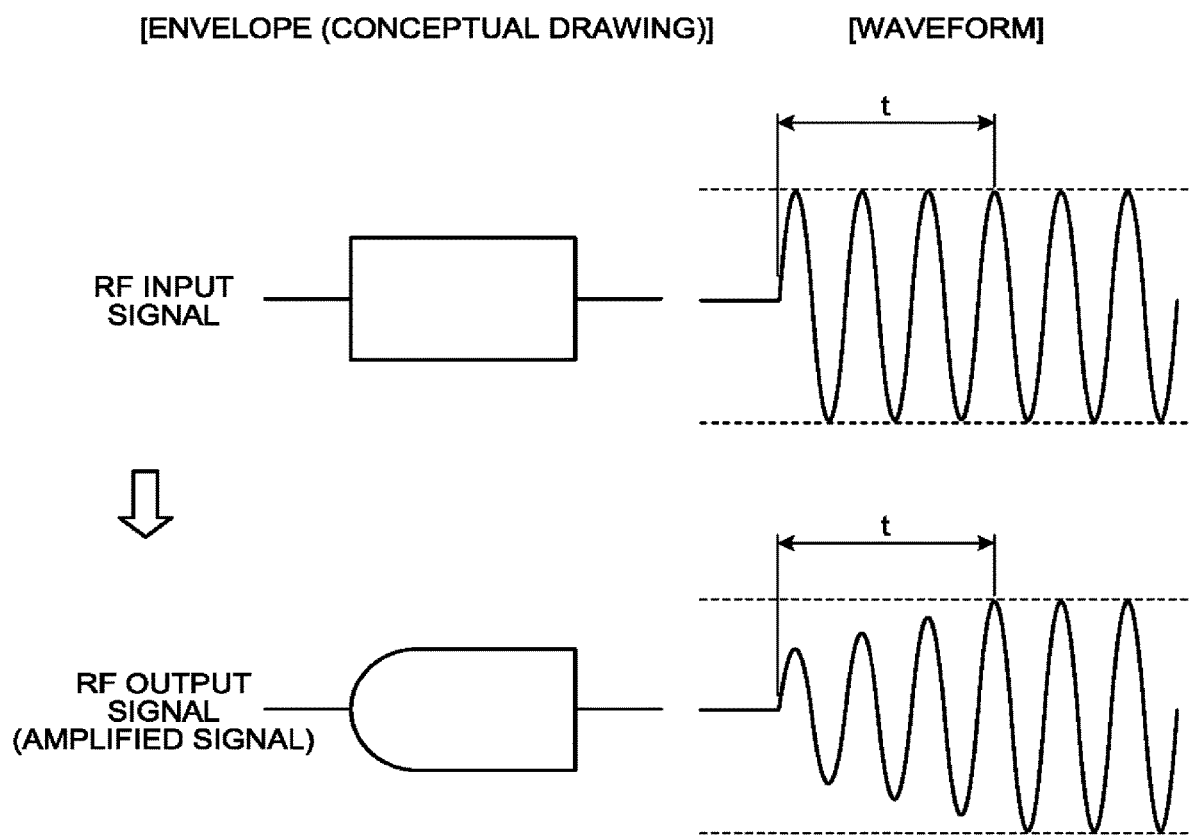
FIG. 5 is a drawing illustrating an example of a delay in rising of an amplified signal.

FIG. 5 is a drawing for explaining the delay in the rising of amplifying circuitry. As illustrated in FIG. 5, when an RF input signal generated to have the waveform exactly defined by the envelope is input to the amplifying circuitry, the RF input signal does not get sufficiently amplified until a time period t elapses since the start of the output of the RF output signal. For this reason, the envelope of the RF input signal is different from the envelope of the RF output signal. It may therefore be difficult, in some situations, to cause the RF output signal to reproduce the waveform defined by the envelope of the RF input signal. The time period t by which the amplifying process is delayed illustrated in FIG. 5 is dependent on the characteristic of the amplifying circuitry and is determined in advance for each amplifying circuitry.

To cope with this situation, the synthesizer 72 according to the present embodiment is configured to increase the amplitude of the obtained envelope, only for the time period t corresponding to the rising characteristic of the amplifying circuitry 75 since the start of the input of the RF input signal.

Figure 3:
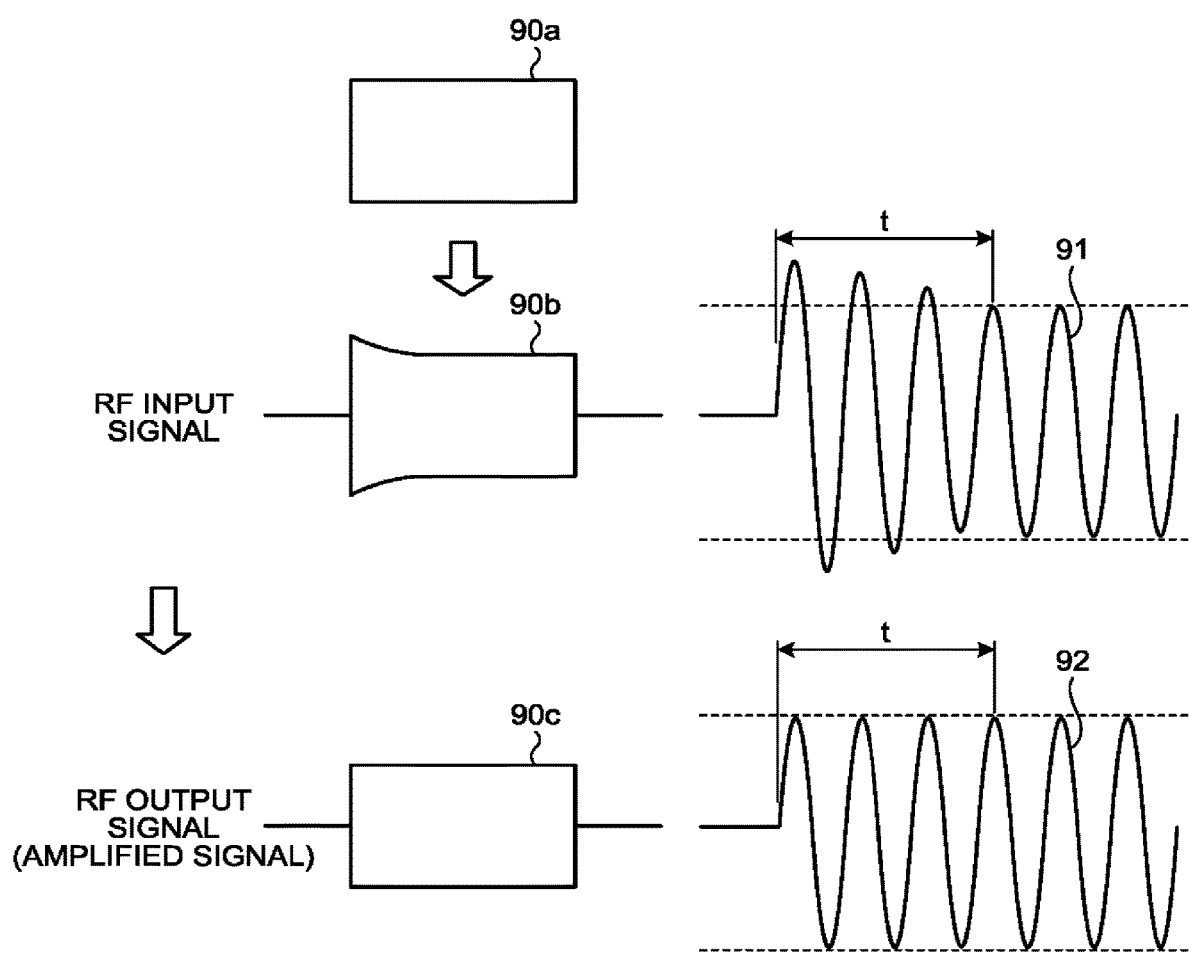
FIG. 3 is a drawing illustrating examples of an RF input signal and an RF output signal according to the embodiment.

FIG. 3 is a drawing illustrating examples of the RF input signal and the RF output signal according to the present embodiment. An envelope 90a illustrated in FIG. 3 is the envelope 90a obtained by the DEMUR 71 from the sequence controlling circuitry 110. An envelope 90b is the envelope 90a that has been corrected by the synthesizer 72. As illustrated in FIG. 3, in the envelope 90b, the amplitude in the rising part is larger than that in the envelope 90a.

A waveform 91 of the RF input signal illustrated in FIG. 3 is a waveform generated by the synthesizer 72 on the basis of the envelope 90b resulting from the correction. In the waveform 91 of the RF input signal, the amplitude observed in the time period t since the start of the input of the RF input signal is larger than the amplitude defined by the envelope 90a prior to the correction, whereas the amplitude observed after the lapse of time period t is the amplitude defined by the envelope 90a.

Further, a waveform 92 is the waveform of the RF output signal obtained as a result of the amplifying circuitry 75 amplifying the waveform 91 of the RF input signal. An envelope 90c is the envelope indicating the shape of the waveform 92. The waveform 91 of the RF input signal is enlarged so as to cancel out the delay in the amplification occurring in the rising characteristic of the amplifying circuitry 75. Accordingly, the waveform 92 is able to reproduce the shape defined by the envelope 90a prior to the correction. Consequently, the envelope 90c has the same shape as that of the envelope 90a. The correction made on the envelope 90a by the synthesizer 72, illustrated in FIG. 3, to cancel out the delay in the amplification occurring in the rising characteristic of the amplifying circuitry 75 will be referred to as a correction made by using an inverse characteristic to the rising characteristic of the amplifying circuitry 75, or an inverse correction of the rising delay of the amplifying circuitry 75.

In the present embodiment, after obtaining the envelope 90a, the synthesizer 72 generates the envelope 90b by correcting the envelope 90a in advance, before being notified by the clock circuitry 74 of the timing to start inputting the RF input signal to the amplifying circuitry 75. For example, the synthesizer 72 has storage and saves the envelope 90b resulting from the correction into the storage. Alternatively, the storage may be provided within the transmission circuitry 107, separately from the synthesizer 72.

Returning to the description of FIG. 2, on the basis of the time information 113, the clock circuitry 74 is configured to notify the synthesizer 72 of the timing to start inputting the RF input signal to the amplifying circuitry 75. More specifically, the timing to start inputting the RF input signal to the amplifying circuitry is the time to start outputting the RE output signal that is defined in the time information 113.

The coupler 76 is configured to transmit (output) the RF output signal output from the amplifying circuitry 75 to the transmission coil 106 and to the controlling circuitry 73. The coupler 76 is an example of the directional coupler according to the present embodiment.

The controlling circuitry 73 is configured to control operations of the amplifying circuitry 75. More specifically, the controlling circuitry 73 sets the status of the amplifying circuitry 75 to one selected from between "standby" and "operate", on the basis of the status of the amplifying circuitry 75 indicated in the control information 112.

Further, the controlling circuitry 73 is configured to receive feedback of the output result, by receiving the RF output signal transmitted thereto from the coupler 76. More specifically, the controlling circuitry 73 receives the RF output signal transmitted thereto from the coupler 76 and judges whether or not the output level of the RF output signal is within a certain range. The output level of the RF output signal is expressed with the unit dBm, for example. When the RF output signal is outside the certain range, the controlling circuitry 73 corrects the output level by controlling the amplifying circuitry 75.

The output level of the RE output signal fluctuates depending on the temperature of the amplifying circuitry 75, for example. More specifically, when the temperature of the amplifying circuitry 75 rises, the output level of the RF output signal output from the amplifying circuitry 75 becomes lower. On the contrary, when the temperature of the amplifying circuitry 75 falls, the output level of the RF output signal output from the amplifying circuitry 75 becomes higher. When the output level of the RF output signal transmitted thereto from the coupler 76 is higher than the certain range, the controlling circuitry 73 controls the amplifying circuitry 75 to lower the output level. On the contrary, when the output level of the RF output signal transmitted thereto from the coupler 76 is lower than the certain range, the controlling circuitry 73 controls the amplifying circuitry 75 to raise the output level. The certain range of the output level may be stored, in advance, in storage or the like within the transmission circuitry 107 or may be defined in the controlling circuitry 73.

The transmission circuitry 107 according to the present embodiment has obtained the RF information 111, the control information 112, and the time information 113 as the digital data. Accordingly, regardless of the timing with which these pieces of information were obtained, the transmission circuitry 107 outputs the amplified signal to the transmission coil 106 in accordance with the timing defined in the time information 113 indicating when to start outputting the amplified signal (the RF output signal).

For example, unlike the example in the present embodiment, another transmission circuitry is known which is configured to amplify a radio frequency signal input thereto as an analog signal and to output the amplified signal. In such transmission circuitry to which a radio frequency signal is input as an analog signal, the timing is not indicated by the time information, but the output of the amplified signal is started at the time when the input of the analog signal is received. In contrast, the transmission circuitry 107 according to the present embodiment does not start outputting the RF output signal until the time defined by the time information 113. It is therefore possible to obtain the RF information 111 prior to the output timing and to correct the envelope 90a in advance.

Figure 4:
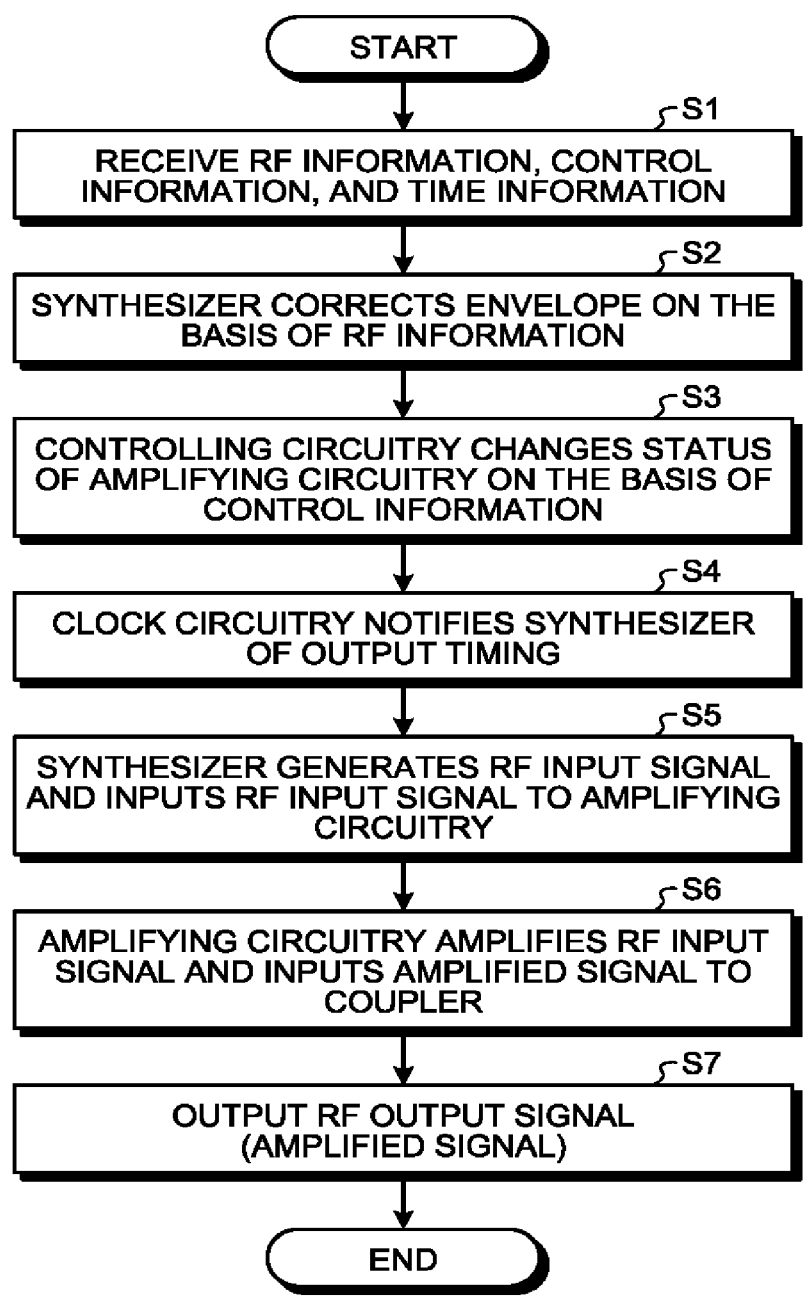
FIG. 4 is a flowchart illustrating an example of a flow in an output process of the RF output signal according to the embodiment.

Next, a flow in the output process of the RF output signal performed by the transmission circuitry 107 configured as described above will be explained. FIG. 4 is a flowchart illustrating an example of the flow in the output process of the RF output signal according to the present embodiment.

The DEMUX 71 receives (obtains) the RF information 111, the control information 112, and the time information 113, from the sequence controlling circuitry 110, each as digital data (S1). The DEMUX 71 transmits the obtained RF information 111 to the synthesizer 72. Further, the DEMUX 71 transmits the obtained control information 112 the controlling circuitry 73. The DEMUX 71 transmits the obtained time information 113 to the clock circuitry 74.

Subsequently, the synthesizer 72 corrects the envelope 90a on the basis of the obtained RF information 111 (the envelope 90a) and the rising characteristic of the amplifying circuitry 75 (S2).

Further, the controlling circuitry 73 changes the status of the amplifying circuitry 75 on the basis of the status of the amplifying circuitry 75 indicated in the control information 112 (S3). In the present example, the status of the amplifying circuitry 75 is changed from "standby" to "operate".

After that, the clock circuitry 74 judges whether or not the time (the timing) to start inputting the RF input signal to the amplifying circuitry 75 has arrived, on the basis of the time information 113. In the present embodiment, the time to start inputting the RF input signal to the amplifying circuitry 75 is the same as the time defined in the time information 113 indicating when to start outputting the RF output signal. When determining that the time to start inputting the RF input signal to the amplifying circuitry 75 has arrived, the clock circuitry 74 notifies the synthesizer 72 that it is time to start inputting the RF input signal to the amplifying circuitry 75, i.e., it is the output timing (S4).

Further, when being notified by the clock circuitry 74 of the timing to start inputting the RF input signal, the synthesizer 72 generates the RE input signal on the basis of the envelope 90b resulting from the correction and inputs the generated RF input signal to the amplifying circuitry 75 (S5).

Subsequently, the amplifying circuitry 75 amplifies the RF input signal input thereto from the synthesizer 72 and inputs the RF output signal (the amplified signal) to the coupler 76 (S6).

The coupler 76 outputs the RE output signal (the amplified signal) input thereto from the amplifying circuitry 75, to the transmission coil 106 and to the controlling circuitry 73 (S7). On the basis of the RE output signal input thereto, the transmission coil 106 generates a radio frequency magnetic field and applies the radio frequency magnetic field to the patient P. The process in the flowchart thus ends.

FIG. 4 illustrates the example in which the DEMUX 71 obtains the RF information 111, the control information 112, and the time information 113 at the same time, from the sequence controlling circuitry 110; however, the timing with which the pieces of information are obtained is not limited to that in this example. For instance, the sequence controlling circuitry 110 may, at first, transmit the RE information 111 to the DEMUX 71, and subsequently transmit the time information 113, before transmitting the control information 112 at last. The RE information 111 has the largest amount of data among the RE information 111, the control information 112, and the time information 113. Accordingly, the sequence controlling circuitry 110 may transmit the RF information 111 in advance during a time period when the network has a smaller load.

Conventionally, magnetic resonance imaging apparatuses use an RE amplifier configured to amplify an RF signal. However, according to conventional techniques, it is difficult, in some situations, to output an amplified signal that reproduces a predetermined signal waveform with a high level of precision, because there is a delay in the rising of the RF signal (amplified signal) amplified by amplifying circuitry.

In contrast, the transmission circuitry 107 according to the present embodiment is configured to obtain the envelope 90a as the digital data, to correct the obtained envelope 90a on the basis of the rising characteristic of the amplifying circuitry 75, and to output the amplified signal obtained as a result of the amplifying circuitry 75 amplifying the RF input signal generated on the basis of the envelope 90b resulting from the correction. Thus, because the envelope 90a obtained as the digital data is corrected on the basis of the rising characteristic of the amplifying circuitry 75, the transmission circuitry 107 according to the present embodiment is able to bring the waveform of the amplified signal to be output closer to the waveform defined as the envelope 90a. Consequently, the transmission circuitry 107 according to the present embodiment is able to output the amplified signal that reproduces the predetermined radio frequency signal waveform with a high level of precision.

Further, the transmission circuitry 107 according to the present embodiment is configured to obtain, as the digital data, the time information 113 indicating the timing to start outputting the amplified signal, to generate the RF input signal on the basis of the envelope 90b resulting from the correction with the timing indicated by the time information 113, and to input the generated RF input signal to the amplifying circuitry 75. Consequently, regardless of the timing with which the RF information 111 and the like are obtained, the transmission circuitry 107 according to the present embodiment is able to output the RF output signal to the transmission coil 106 in accordance with the timing defined in the time information 113 indicating when to start outputting the RF output signal. Further, the transmission circuitry 107 according to the present embodiment is able to obtain the RF information 111 prior to the time to start outputting the RF output signal and to correct the envelope 90a in advance.

There is, for example, an MRI method that decreases an Echo Time (TE) to 1 ms or less like an Ultrashort TE (UTE) and thereby draws internal structure of a living body having a short T2 value with a high level of precision. For the UTE, a pulse having steep rising and a short application time is used as a radio frequency signal (amplified signal) that is applied for excitation. When such a method is taken, the radio frequency amplifying device is required to reproduce the shape of the pulse defined by a computer system with a high level of precision and to control timing to output the pulse with a high level of precision. A conventional radio frequency amplifying device that is configured to amplify a radio frequency signal input thereto as an analog signal and to output the amplified signal, however, has difficulty in controlling the shape of the pulse or the output timing with a high level of precision. In contrast, the transmission circuitry 107 according to the present embodiment is configured to obtain the envelope 90a as the digital data and to correct the envelope 90a in accordance with the rising characteristic. With this configuration, the transmission circuitry 107 according to the present embodiment is able to reproduce the shape of the pulse defined by the computer system with a high level of precision. In addition, because the time information 113 is obtained as the digital data, the transmission circuitry 107 according to the present embodiment is able to control the timing to output the pulse with a high level of precision. Consequently, because, for example, the shape of the pulse that is output as the amplified signal and the output timing are controlled with a high level of precision, the transmission circuitry 107 according to the present embodiment is able to easily address an imaging method requiring the pulse to be applied for an extremely short time like UTE. It is noted that, although the UTE has been explained as an example, the transmission circuitry 107 according to the present embodiment can also be applied to any other MRI methods.

Further, the transmission circuitry 107 according to the present embodiment is configured to increase the amplitude of the obtained envelope 90a only for the time period t corresponding to the rising characteristic of the amplifying circuitry 75 since the start of the input of the RF input signal. Consequently, the transmission circuitry 107 according to the present embodiment is able to output the amplified signal having the predetermined radio frequency signal waveform, even when the amplification of the RF input signal by the amplifying circuitry 75 fails to reach the prescribed degree during the time period between the start of the output and the time when the time period t has elapsed. Consequently, the transmission circuitry 107 according to the present embodiment is able to reduce the delay in the rising of the amplifying circuitry 75 and to output the amplified signal that reproduces the predetermined radio frequency signal waveform with a high level of precision.

Further, the transmission circuitry 107 according to the present embodiment includes the clock circuitry 74 configured to notify the synthesiser 72 of the timing of the RF input signal to the amplifying circuitry 75, on the basis of the time information 113. Consequently, the transmission circuitry 107 according to the present embodiment is able to easily control the input timing of the RE input signal for the synthesiser 72.

Further, the transmission circuitry 107 according to the present embodiment is configured to transmit the RF output signal being output to the transmission coil 106, also to the controlling circuitry 73 provided therein and to further change the output level of the amplifying circuitry 75 on the basis of the RF output signal. Consequently, the transmission circuitry 107 according to the present embodiment is able to properly correct the output level of the RF output signal on the basis of the feedback of the output result.

Further, the MRI apparatus 100 according to the present embodiment is configured to cause the sequence controlling circuitry 110 to transmit the envelope 90a and the time information 113 the transmission circuitry 107, as the digital data. Consequently, the MRI apparatus 100 according to the present embodiment is able to reduce the rising delay of the amplifying circuitry 75 and to output the amplified signal that reproduces the predetermined radio frequency signal waveform with a high level precision.

Instead of changing the status of the amplifying circuitry 75 to "operate" at the time when the control information 112 is obtained, the controlling circuitry 73 may change the status of the amplifying circuitry 75 to "operate" at the time when the controlling circuitry 73 is notified by the clock circuitry 74 of the timing to start outputting the RF output signal. Alternatively, the control information 112 may be configured not only to indicate the status of the element to be changed, but also information indicating a time at which the status is to be changed.

The synthesizer 72, the controlling circuitry 73, the clock circuitry 74, and the amplifying circuitry 75 according to the present embodiment may be realized by using one or more processors or may be realized by using a combination of software and hardware.

The term "processor" used in the above explanations denotes, for example, a Central Processing Unit (CPU), a Graphics Processing Unit (GPU), or circuitry such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). Instead of the programs being saved in the storage 122, the programs may directly be incorporated into the circuitry of one or more processors. In that situation, the one or more processors realize the functions by reading and executing the programs incorporated in the circuitry thereof.

Further, although the above-mentioned embodiments have been explained using a radio frequency amplifying device as an example, the structure of the present embodiment may be applied to any other amplifiers, such as a gradient magnetic field amplifier. The amplifier in this case includes, for example, obtaining circuitry configured to obtain an envelope indicating a waveform of an output signal as digital data; correcting circuitry configured to correct the obtained envelope on the basis of a rising characteristic of amplifying circuitry and to input the signal generated on the basis of the envelope resulting from the correction to the amplifying circuitry; and the amplifying circuitry configured to output an amplified signal obtained by amplifying the signal received from the correcting circuitry.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplifier comprising:
    amplifying circuitry configured to output an amplified signal obtained by amplifying a signal input thereto;
    obtaining circuitry configured to obtain an envelope indicating a waveform of an output signal as digital data; and
    correcting circuitry configured to correct the obtained envelope on a basis of a rising characteristic of the amplifying circuitry and to input the signal generated on a basis of the envelope resulting from the correction to the amplifying circuitry.

2. A radio frequency amplifying device comprising:
    amplifying circuitry configured to output an amplified signal obtained by amplifying a signal input thereto;
    obtaining circuitry configured to obtain an envelope indicating a waveform of a radio frequency signal as digital data; and
    correcting circuitry configured to correct the obtained envelope on a basis of a rising characteristic of the amplifying circuitry and to input the signal generated on a basis of the envelope resulting from the correction to the amplifying circuitry.

3. The radio frequency amplifying device according to claim 2, wherein
    the obtaining circuitry further obtains time information indicating timing to start outputting the amplified signal, as digital data, and
    according to the timing indicated by the time information, the correcting circuitry generates the signal on the basis of the envelope resulting from the correction and inputs the generated signal to the amplifying circuitry.

4. The radio frequency amplifying device according to claim 2, wherein the correcting circuitry increases amplitude of the obtained envelope only for a time period corresponding to the rising characteristic of the amplifying circuitry since a start of the input of the signal.

5. The radio frequency amplifying device according to claim 3, further comprising: clocking circuitry configured to notify the correcting circuitry of timing to start inputting the signal to the amplifying circuitry, on a basis of the time information, wherein
    according to the timing of which the correcting circuitry is notified by the clocking circuitry, the correcting circuitry generates the signal on the basis of the envelope resulting from the correction and inputs the generated signal to the amplifying circuitry.

6. The radio frequency amplifying device according to claim 2, further comprising:
    controlling circuitry configured to control an operation of the amplifying circuitry; and
    a directional coupler configured to transmit the amplified signal output from the amplifying circuitry, to a transmission coil configured to generate a radio frequency magnetic field based on the amplified signal and to the controlling circuitry, wherein
    the controlling circuitry changes an output level of the amplifying circuitry on a basis of the amplified signal being input thereto.

7. A magnetic resonance imaging apparatus comprising the radio frequency amplifying device according to claim 2, further comprising:
    sequence controlling circuitry configured to output, to the obtaining circuitry, the envelope before being corrected and time information indicating timing to start outputting the amplified signal, as digital data.

* * * * *